(12) United States Patent
Cho et al.

(10) Patent No.: US 8,149,590 B2
(45) Date of Patent: Apr. 3, 2012

(54) CIRCUIT BOARD FIXING ELEMENT

(75) Inventors: Chin-Hsing Cho, Douliou (TW); Simon Pan, Fuzhou (CN); Tsao-Yuan Fu, Taoyuan County (TW)

(73) Assignee: Chunghwa Picture Tubes, Ltd., Padeh, Taoyuan (TW)

( * ) Notice: Subject to any disclaimer, the term of this patent is extended or adjusted under 35 U.S.C. 154(b) by 231 days.

(21) Appl. No.: 12/635,230

(22) Filed: Dec. 10, 2009

(65) Prior Publication Data

US 2011/0075329 A1 Mar. 31, 2011

(30) Foreign Application Priority Data

Sep. 30, 2009 (TW) ................................ 98218054 U

(51) Int. Cl.
*H05K 7/14* (2006.01)

(52) U.S. Cl. ........ 361/804; 361/742; 361/758; 361/770; 174/138 E; 174/138 G

(58) Field of Classification Search .................. 361/742, 361/758, 770, 804, 807; 174/138 E, 138 G
See application file for complete search history.

(56) References Cited

U.S. PATENT DOCUMENTS

| | | | |
|---|---|---|---|
| 6,399,888 B1 * | 6/2002 | Chen | 174/138 G |
| 6,542,372 B1 * | 4/2003 | Paquin et al. | 361/758 |
| 6,809,916 B2 * | 10/2004 | Nakata et al. | 361/115 |
| 7,119,276 B2 * | 10/2006 | Pav et al. | 174/542 |
| 7,760,514 B2 * | 7/2010 | Latal et al. | 361/804 |

FOREIGN PATENT DOCUMENTS

| | | |
|---|---|---|
| TW | I277808 | 2/2006 |
| TW | 200907484 | 8/2007 |

* cited by examiner

*Primary Examiner* — Dameon Levi
(74) *Attorney, Agent, or Firm* — Muncy, Geissler, Olds & Lowe, PLLC

(57) ABSTRACT

A circuit board fixing element is provided. The circuit board fixing element is used for fixing a circuit board on a sheet, and includes a fixing portion, a buckling portion, and a connecting portion. The buckling portion is made of a resilient material. The connecting portion is connected between the fixing portion and the buckling portion, and has two opposite ends and a side surface connected to the ends. The fixing portion and the buckling portion are respectively located on the ends and protrude from the side surface.

12 Claims, 7 Drawing Sheets

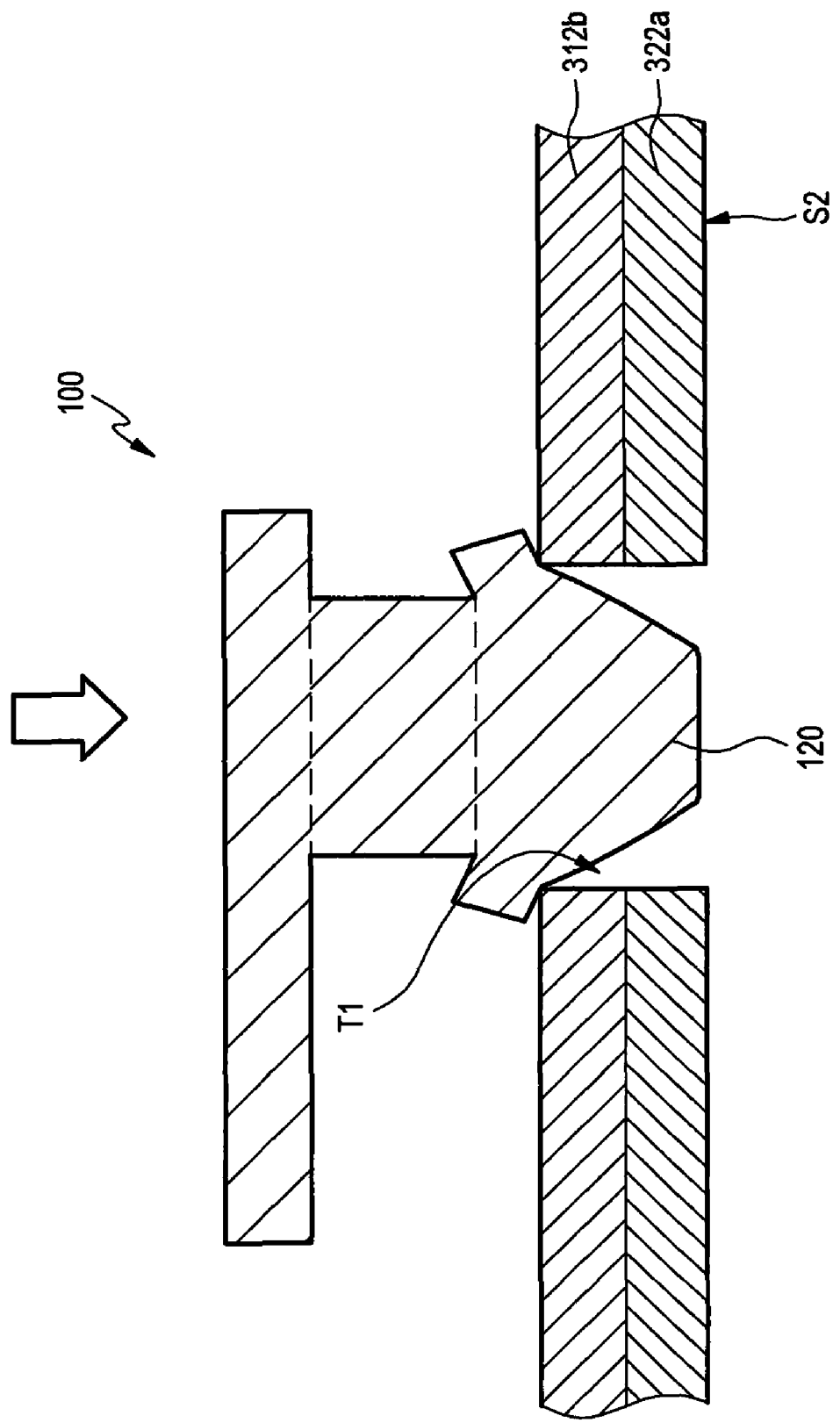

CIRCUIT BOARD FIXING ELEMENT

CROSS-REFERENCE TO RELATED APPLICATION

This application claims the benefit of Taiwan Patent Application No. 098218054, filed on Sep. 30, 2009, which is hereby incorporated by reference for all purposes as if fully set forth herein.

BACKGROUND OF THE INVENTION

1. Field of Invention

The present invention relates to an element for fixing an object, and more particularly to an element for fixing a circuit board.

2. Related Art

In the current optoelectronic industry, a common liquid crystal display (LCD) panel includes a thin film transistor array substrate and a rigid-flex circuit board, in which the rigid-flex circuit board is connected to the thin film transistor array substrate.

In view of the above, the rigid-flex circuit board includes at least a flexible circuit board and a rigid circuit board, and the rigid circuit board is connected to the thin film transistor array substrate through the flexible circuit board. A drive chip is mounted on the rigid circuit board, and is electrically connected to the thin film transistor array substrate through the rigid circuit board and the flexible circuit board. As such, the drive chip can drive and control the thin film transistor array substrate.

The rigid circuit board is usually locked on a metal backplane of a backlight module by screws. In this way, the rigid circuit board can be fixed in the interior of the LCD to avoid the movement of the rigid circuit board, thereby preventing the damage to the LCD caused by the collision of the rigid circuit board with the LCD panel.

SUMMARY OF THE INVENTION

The present invention provides a circuit board fixing element, which is used to fix the circuit board.

The present invention provides a circuit board fixing element, which is used for fixing a circuit board on a sheet and comprises a fixing portion, a buckling portion, and a connecting portion. The buckling portion is made of a resilient material. The connecting portion is connected between the fixing portion and the buckling portion and having two opposite ends and a side surface connected to the ends, wherein the fixing portion and the buckling portion are respectively located on the ends and protrude from the side surface.

In one embodiment, the resilient material is a rubber material.

In one embodiment, the rubber material comprises silicon rubber or conductive rubber.

In one embodiment, the fixing portion and the connecting portion are made of the resilient material.

In one embodiment, the fixing portion, the connecting portion, and the buckling portion are integrally formed.

In one embodiment, the circuit board has a first through hole, the sheet has a second through hole, and the connecting portion is inserted in the first through hole and the second through hole.

In one embodiment, the buckling portion has a top face and a bottom face opposite to the top face, and an area of the top face is smaller than an area of the bottom face.

In one embodiment, a shape of the buckling portion is conical.

In one embodiment, a shape of the buckling portion is tabular.

In one embodiment, a shape of the fixing portion is discal.

In one embodiment, a shape of the fixing portion is strip-like, and the fixing portion has a plane, a first end face, and a second end face, the plane is connected between the first end face and the second end face, the connecting portion is located at the plane, and a distance between the connecting portion and the first end face is smaller than a distance between the connecting portion and the second end face.

Since a fixing portion and a buckling portion protrude from a side surface, the fixing element of the circuit board according to the present invention is capable of confining the circuit board and a sheet between the fixing portion and the buckling portion, thereby fixing the circuit board on the sheet.

In order to make the above features and advantages of the present invention more comprehensible, the present invention is further described in detail below with reference to embodiments and the accompanying drawings.

BRIEF DESCRIPTION OF THE DRAWINGS

FIG. 2C is a cross-sectional view illustrated a process for the fixing element of FIG. 2B being assembled to a circuit board;

DETAILED DESCRIPTION OF THE INVENTION

Figure 1:
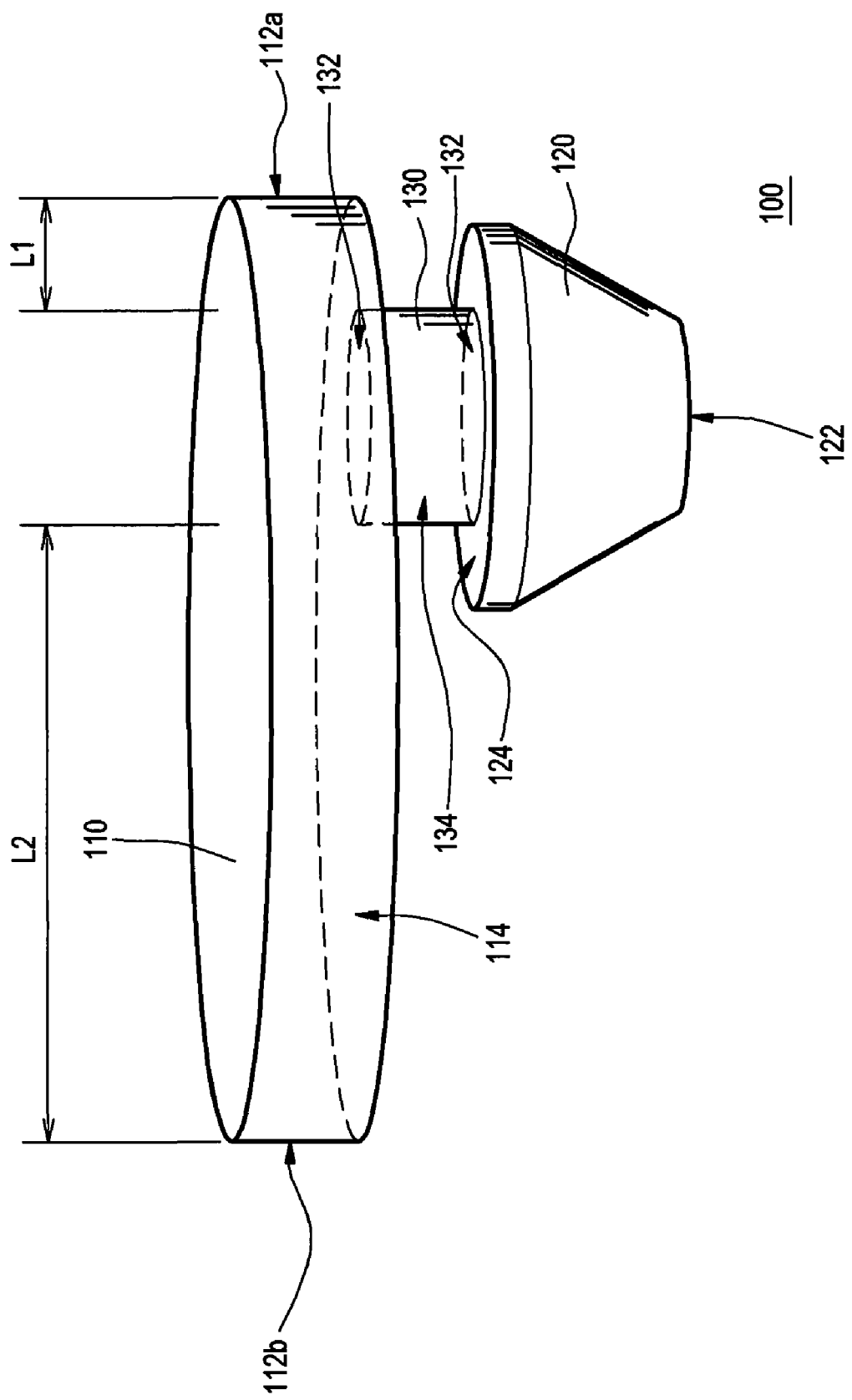
FIG. 1 is a three-dimensional view of a circuit board fixing element according to a first embodiment of the present invention.

FIG. 1 is a three-dimensional view of a circuit board fixing element according to a first embodiment of the present invention. Referring to FIG. 1, a circuit board fixing element 100 according to the embodiment includes a fixing portion 110, a buckling portion 120, and a connecting portion 130, in which the connecting portion 130 is connected between the fixing portion 110 and the buckling portion 120.

Specifically, the connecting portion 130 has two opposite ends 132 and a side surface 134, in which the side surface 134 is connected to the ends 132, and is located between the ends 132, and the fixing portion 110 and the buckling portion 120 are respectively located on the ends 132 and protrude from the side surface 134. Therefore, the connecting portion 130 is disposed between the fixing portion 110 and the buckling portion 120.

The buckling portion 120 has a top face 122 and a bottom face 124, in which the top face 122 is opposite to the bottom face 124. In the embodiment shown in FIG. 1, an area of the top face 122 may be smaller than that of the bottom face 124, and the shape of the buckling portion 120 may be conical.

The shape of the fixing portion 110 may be strip-like, as shown in FIG. 1. Specifically, the fixing portion 110 has a first end face 112a, a second end face 112b, and a plane 114, in which the plane 114 is connected between the first end face 112a and the second end face 112b. The connecting portion 130 is located on the plane 114, and a distance L1 between the connecting portion 130 and the first end face 112a is smaller than a distance L2 between the connecting portion 130 and the second end face 112b. In other words, the connecting portion 130 is close to the first end face 112a and is away from the second end face 112b.

In this embodiment, the buckling portion 120 is made of a resilient material, and the resilient material may be a rubber material, which includes silicon rubber having insulation performance, or conductive rubber having conductivity. Here, the conductive rubber is a rubber doped with conductive particles such as metal particles, and the conductive rubber becomes conductive through these conductive particles.

Additionally, the fixing portion 110 and the connecting portion 130 may also be made of the above resilient material, and the fixing portion 110, the connecting portion 130, and the buckling portion 120 may be integrally formed. For example, the fixing portion 110, the connecting portion 130, and the buckling portion 120 are manufactured through the same injection molding process. Therefore, the fixing portion 110, the connecting portion 130, and the buckling portion 120 can be made of the same resilient material.

The circuit board fixing element 100 can fix the circuit board on the sheet, and in order to make people clearly understand how the fixing element 100 fixes the circuit board, illustrations are given in detail below by taking an LCD module as an example with reference to FIGS. 2A to 2C.

Figure 2A:
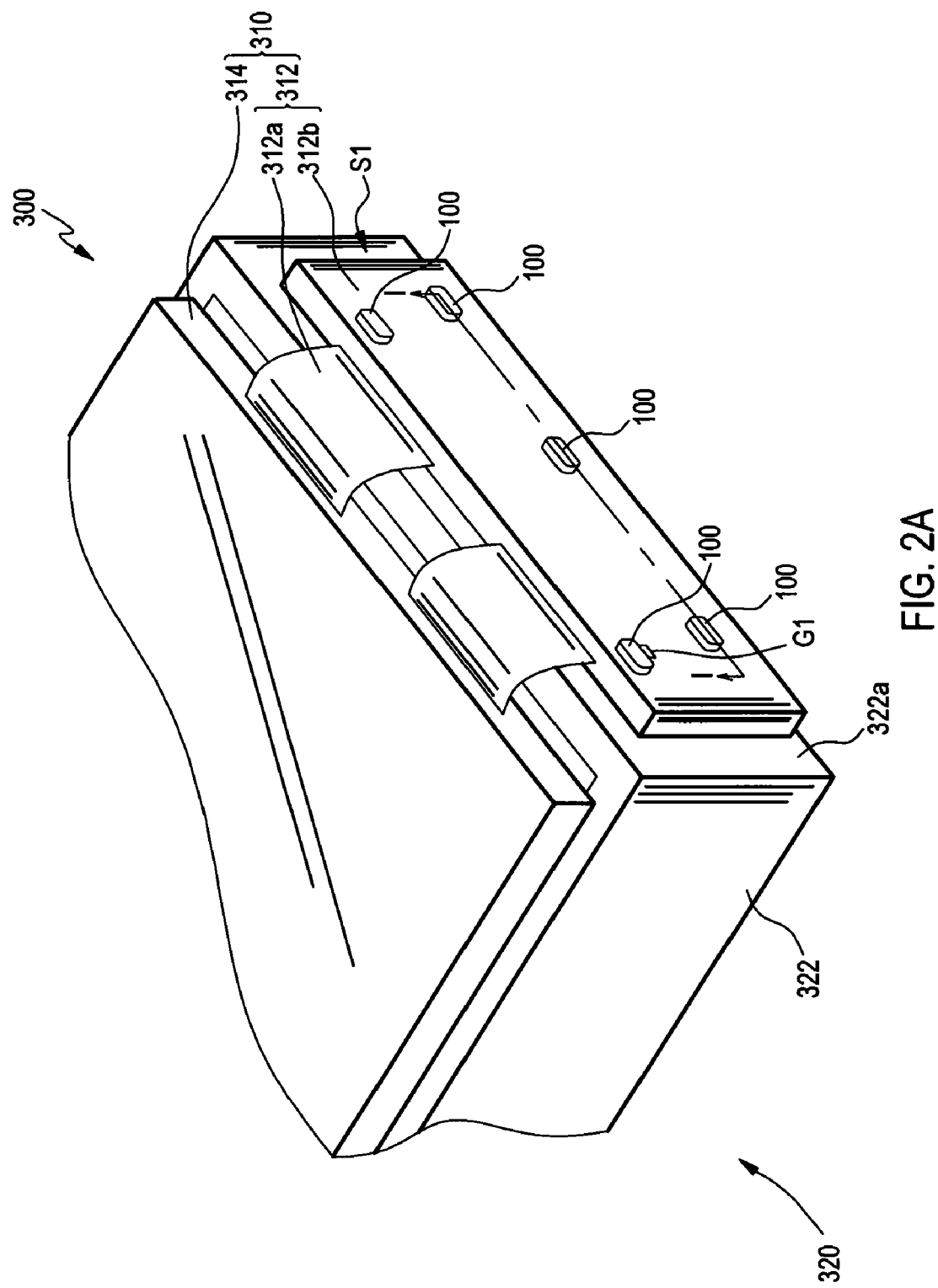
FIG. 2A shows the fixing elements of FIG. 1 and a liquid crystal display (LCD) module assembled with the fixing elements.

FIG. 2A shows the fixing elements of FIG. 1 and a liquid crystal display (LCD) module assembled with the fixing elements. The circuit board fixing elements 100 may be applied to an LCD module 300, and the LCD module 300 includes an LCD panel 310 and a backlight module 320, in which the LCD panel 310 includes a circuit board 312 and a thin film transistor array substrate 314, and the backlight module 320 includes a backplane 322.

The backplane 322 has a sheet 322a, and may be made of a metal material. The circuit board 312 is connected to the thin film transistor array substrate 314, and may be a rigid-flex circuit board, that is, the circuit board 312 includes at least a flexible circuit board 312a and a rigid circuit board 312b. The rigid circuit board 312b is connected to the flexible circuit board 312a, and is electrically connected to the thin film transistor array substrate 314 through the flexible circuit board 312a. Additionally, a drive chip (not shown) for driving and controlling the thin film transistor array substrate 314 is mounted on the rigid circuit board 312b.

As described above, the circuit board fixing elements 100 can fix the circuit board 312 on the sheet 322a, in which the circuit board 312 may be fixed by a plurality of circuit board fixing elements 100, as shown in FIG. 2A. However, in other embodiments (not shown), the circuit board 312 may also be fixed by only one circuit board fixing element 100.

Figure 2B:
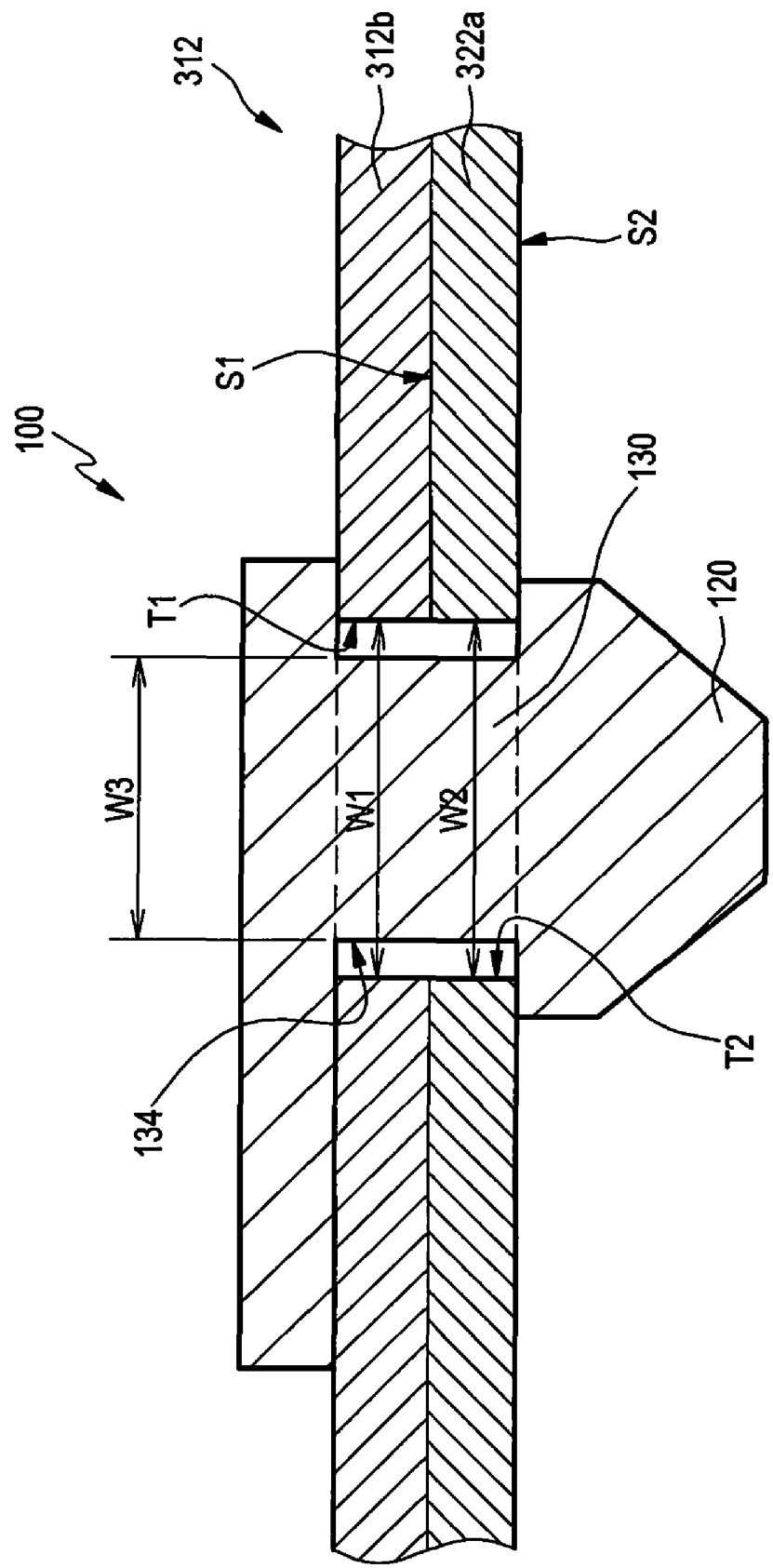
FIG. 2B is a cross-sectional view taken along line I-I of FIG. 2A.

FIG. 2B is a cross-sectional view taken along line I-I of FIG. 2A. Referring to FIGS. 2A and 2B, the circuit board 312 has a plurality of first through holes T1 (only one is shown in FIG. 2B), and the sheet 322a has a plurality of second through holes T2 (only one is shown in FIG. 2B), in which the first through holes T1 are located at the rigid circuit board 312b, and the first through holes T1 are respectively corresponding to the second through holes T2.

Each circuit board fixing element 100 can run through the rigid circuit board 312b and the sheet 322a from one of the first through holes T1 and the corresponding second through holes T2, and the connecting portion 130 is inserted in the first through hole T1 and the second through hole T2. As such, the circuit board fixing elements 100 are mounted on the circuit board 312, and fix the circuit board 312 on the sheet 322a.

Specifically, since the fixing portion 110 and the buckling portion 120 protrude from the side surface 134 of the connecting portion 130, when the connecting portion 130 is inserted in the first through hole T1 and the second through hole T2, the rigid circuit board 312b and the sheet 322a are confined between the fixing portion 110 and the buckling portion 120, such that the circuit board 312 is fixed on the sheet 322a.

In addition, an aperture W1 of the first through holes T1 and an aperture W2 of the second through holes T2 may be greater than a width W3 of the connecting portion 130. Therefore, after the circuit board fixing element 100 fixes the circuit board 312, the rigid circuit board 312b may move along a surface S1 of the sheet 322a slightly.

When the LCD module 300 is moved or is under a vibration test, the rigid circuit board 312b may move along the same direction with the thin film transistor array substrate 314, so as to decrease the amplitude of relative movement between the rigid circuit board 312b and the thin film transistor array substrate 314, thereby reducing the force of the rigid circuit board 312b and the thin film transistor array substrate 314 pulling the flexible circuit board 312a. In this way, the possibility that lines in the flexible circuit board 312a break is lowered, and the electric quality of the flexible circuit board 312a is maintained.

FIG. 2C is a cross-sectional view illustrated a process for the fixing element of FIG. 2B being assembled to a circuit board. Referring to FIGS. 2B and 2C, since the buckling portion 120 is made of a resilient material, and the resilient materials may be rubber materials such as silicon rubber or conductive rubber, when the circuit board fixing element 100 is inserted in the first through hole T1, the buckling portion 120 is pressed by the rigid circuit board 312b and is deformed.

As described above, the deformed buckling portion 120 can pass through the first through hole T1 and the second through hole T2, and through the rigid circuit board 312b and the sheet 322a to protrude from a surface S2 of the sheet 322a. As such, the connecting portion 130 is inserted in the first through hole T1 and the second through hole T2, and the rigid circuit board 312b and the sheet 322a can be confined between the fixing portion 110 and the buckling portion 120, such that the circuit board 312 is fixed on the sheet 322a.

Referring to FIG. 2A again, it should be noted that, the rigid circuit board 312b may has a ground pad G1, and the fixing portion 110, the connecting portion 130, and the buckling portion 120 may be integrally formed with the same conductive rubber. Therefore, one of the first through holes T1 may be designed in a ground pad G1 for mounting the circuit board fixing element 100. In such a manner, the circuit board fixing element 100 can electrically contact the ground pad G1, achieving the function of grounding and reducing the noise generated by the circuit board 312 and the thin film transistor array substrate 314.

Although the LCD module 300 is taken as an example in the above, and how the circuit board fixing element 100 fixes the circuit board 312 is illustrated in detail with reference to FIGS. 2A to 2C, the circuit board fixing element 100 according to the embodiment may also fix any circuit board with through holes, and the circuit board, for example, is a circuit board of a mobile phone or a motherboard of a computer. Therefore, the circuit board fixing element 100 is applicable to technical fields besides the LCD module, which is not limited to the embodiment illustrated in FIG. 2A.

Figure 3:
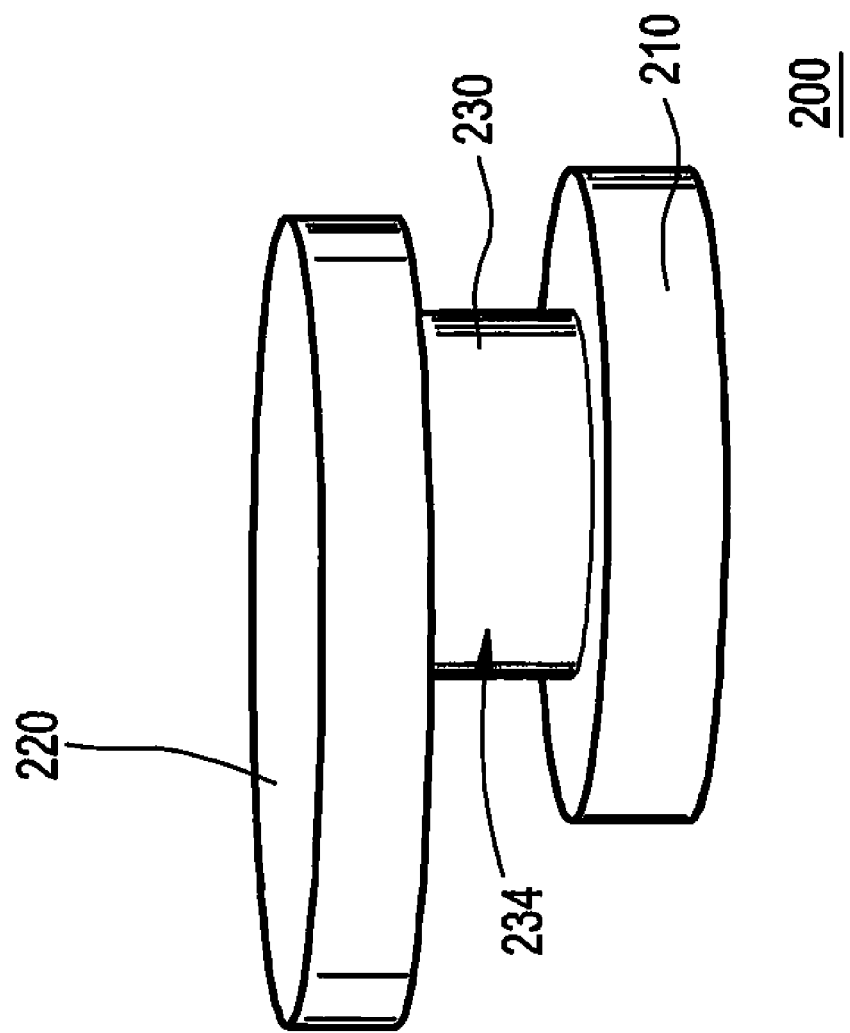
FIG. 3 is a three-dimensional view of a circuit board fixing element according to a second embodiment of the present invention.

FIG. 3 is a three-dimensional view of a circuit board fixing element according to a second embodiment of the present invention. Referring to FIG. 3, the material, functions, and advantages of the circuit board fixing element 200 according to this embodiment and those of the circuit board fixing element 100 according to the first embodiment are substantially the same, and their structures are similar. The differences lie in that, the circuit board fixing element 200 includes a fixing portion 210 and a buckling portion 220, in which the shape of the fixing portion 210 is discal, and the shape of the buckling portion 220 is tabular instead of conical.

Figure 4A:
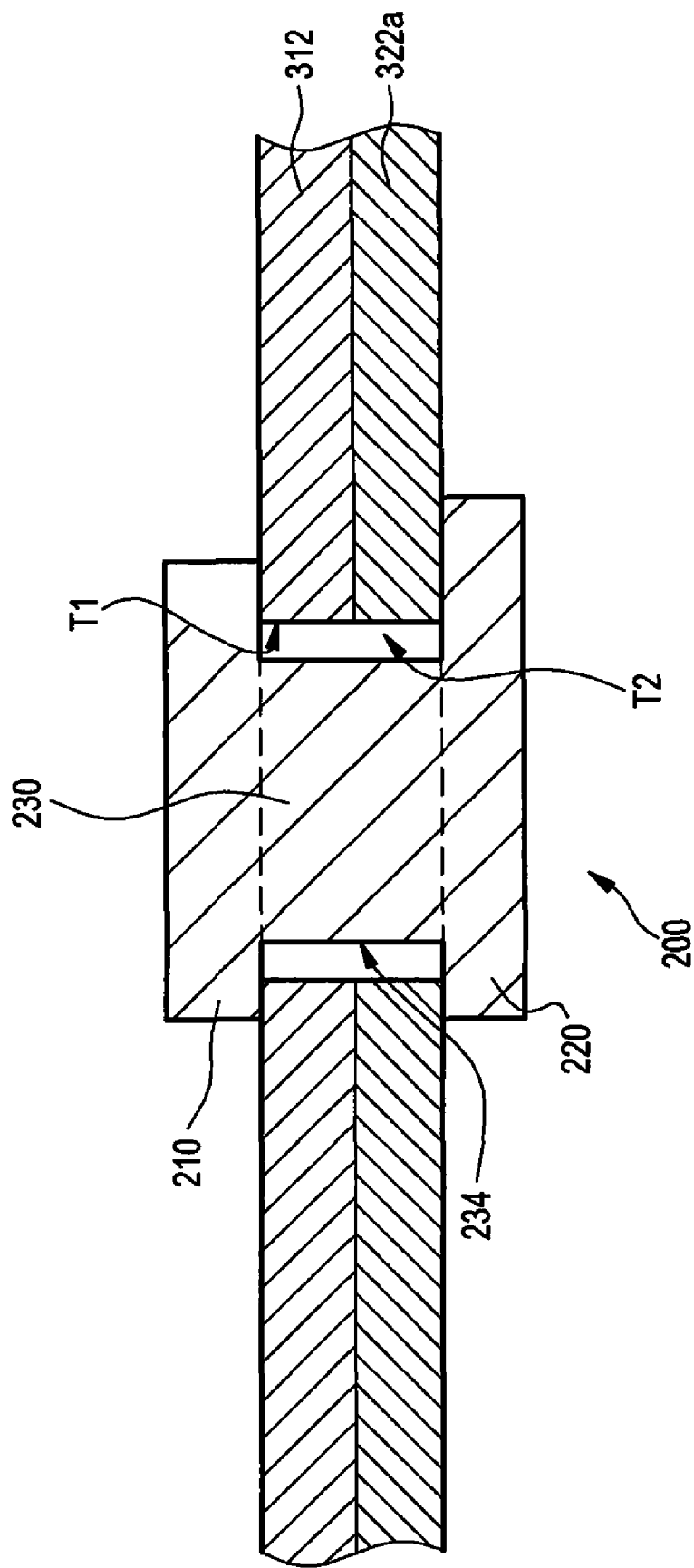
FIG. 4A is a cross-sectional view illustrated the fixing element of FIG. 3 being assembled to a circuit board.

FIG. 4A is a cross-sectional view illustrated the fixing element of FIG. 3 being assembled to a circuit board. Referring to FIGS. 3 and 4A, specifically, the circuit board fixing element 200 further includes a connecting portion 230, and the connecting portion 230 is connected between the fixing portion 210 and the buckling portion 220, in which the fixing portion 210 and the buckling portion 220 protrude from a side surface 234 of the connection portion 230. Therefore, the circuit board 312 and the sheet 322a can be confined between the fixing portion 210 and the buckling portion 220, as shown in FIG. 4A. As such, the circuit board 321 can also be fixed on the sheet 322a.

Figure 4B:
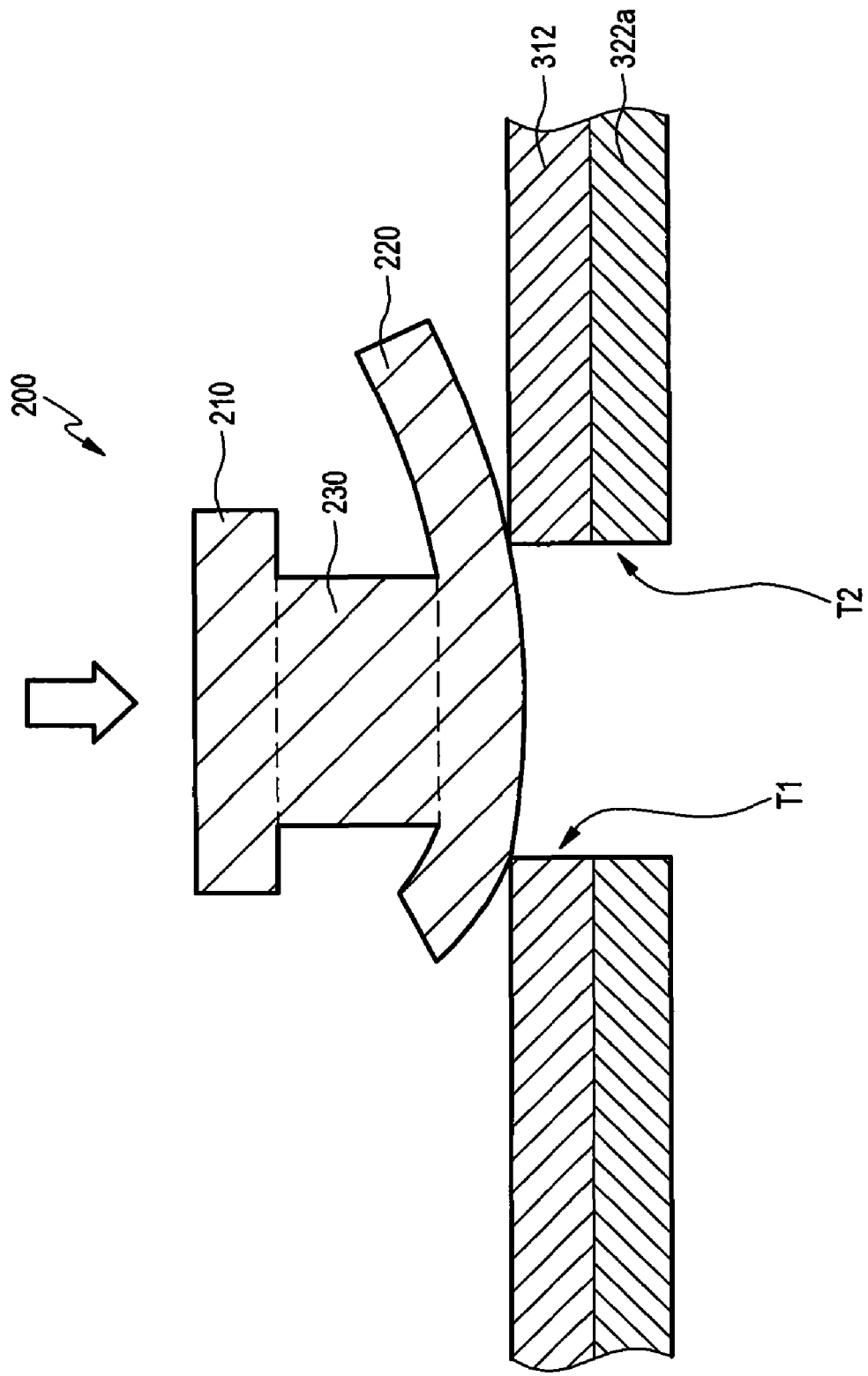
FIG. 4B is a cross-sectional view illustrated a process for the fixing element of FIG. 4A being assembled to a circuit board.

FIG. 4B is a cross-sectional view illustrated a process for the fixing element of FIG. 4A being assembled to a circuit board. Referring to FIGS. 4A and 4B, the buckling portion 220 is made of a resilient material. When the circuit board fixing element 200 is inserted in the first through hole T1, the buckling portion 220 is pressed by the circuit board 312 and is deformed. The deformed buckling portion 220 can pass through the first through hole T1 and the second through hole T2, and through the circuit board 312 and the sheet 322a. Thus, the connecting portion 230 is inserted in the first through hole T1 and the second through hole T2, such that the circuit board 312 is fixed on the sheet 322a.

In addition, the fixing portion 210, the connecting portion 230, and the buckling portion 220 may also be integrally formed with the same conductive rubber. Therefore, the circuit board fixing element 200 can electrically contact the ground pad G1 (as shown in FIG. 2A), achieving the function of grounding and reducing the generation of the noise.

In view of the above, the fixing element of the circuit board according to the present invention can confine the circuit board and the sheet between the fixing portion and the buckling portion, thereby fixing the circuit board on the sheet. Next, the fixing portion, the connecting portion, and the buckling portion may be made of conductive rubber. Therefore, the fixing element of the circuit board according to the present invention can electrically contact the ground pad, thereby achieving the function of grounding and reducing the generation of the noise.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit board fixing element, for fixing a circuit board on a sheet, the fixing element comprising:
a fixing portion;
a buckling portion, made of a resilient material; and
a connecting portion, connected between the fixing portion and the buckling portion, and having two opposite ends and a side surface connected to the ends, wherein the fixing portion and the buckling portion are respectively located on the ends and protrude from the side surface;
wherein a shape of the fixing portion is strip-like, and the fixing portion has a plane, a first end face, and a second end face, the plane is connected between the first end face and the second end face, the connecting portion is located at the plane, and a distance between the connecting portion and the first end face is smaller than a distance between the connecting portion and the second end face.

2. The circuit board fixing element according to claim 1, wherein the resilient material is a rubber material.

3. The circuit board fixing element according to claim 2, wherein the rubber material comprises silicon rubber or conductive rubber.

4. The circuit board fixing element according to claim 1, wherein the fixing portion and the connecting portion are made of the resilient material.

5. The circuit board fixing element according to claim 4, wherein the fixing portion, the connecting portion, and the buckling portion are integrally formed.

6. The circuit board fixing element according to claim 1, wherein the circuit board has a first through hole, the sheet has a second through hole, and the connecting portion is inserted in the first through hole and the second through hole.

7. The circuit board fixing element according to claim 1, wherein the buckling portion has a top face and a bottom face opposite to the top face, and an area of the top face is smaller than an area of the bottom face.

8. The circuit board fixing element according to claim 1, wherein a shape of the buckling portion is conical.

9. The circuit board fixing element according to claim 1, wherein a shape of the buckling portion is tabular.

10. The circuit board fixing element according to claim 1, wherein a shape of the fixing portion is discal.

11. The circuit board fixing element according to claim 1, wherein an aperture diameter of the first through holes and an aperture diameter of the second through holes are greater than a width of the connecting portion.

12. A circuit board fixing element, for fixing a circuit board on a sheet, the fixing element comprising:
a fixing portion;
a buckling portion, made of a resilient material; and
a connecting portion, connected between the fixing portion and the buckling portion, and having two opposite ends and a side surface connected to the ends, wherein the fixing portion and the buckling portion are respectively located on the ends and protrude from the side surface;
wherein:
the circuit board has a first through hole,
the sheet has a second through hole,
the connecting portion is inserted in the first through hole and the second through hole, and
an aperture diameter of the first through holes and an aperture diameter of the second through holes are greater than a width of the connecting portion.

* * * * *